US012649174B2

(12) United States Patent     (10) Patent No.:   US 12,649,174 B2
Lee et al.     (45) Date of Patent:    Jun. 9, 2026

(54) SUBSTRATE PROCESSING APPARATUS

(71) Applicant: SEMES CO., LTD., Cheonan-si (KR)

(72) Inventors: Jongdoo Lee, Cheonan-si (KR); Taejong Choi, Asan-si (KR); Juyeon Song, Sokcho-si (KR); Sangmin Lee, Seoul-si (KR)

(73) Assignee: SEMES CO., LTD., Cheonan-si (KR)

( * ) Notice: Subject to any disclaimer, the term of this patent is extended or adjusted under 35 U.S.C. 154(b) by 229 days.

(21) Appl. No.: 18/393,884

(22) Filed: Dec. 22, 2023

(65) Prior Publication Data

US 2024/0207903 A1     Jun. 27, 2024

(30) Foreign Application Priority Data

Dec. 27, 2022    (KR) ........................ 10-2022-0185900

(51) Int. Cl.
*B08B 3/04*     (2006.01)
*H01L 21/67*     (2006.01)
*H10P 72/00*     (2026.01)
*H10P 72/76*     (2026.01)

(52) U.S. Cl.
CPC ............ *B08B 3/04* (2013.01); *H10P 72/0402* (2026.01); *H10P 72/0414* (2026.01); *H10P 72/0462* (2026.01); *H10P 72/0604* (2026.01); *H10P 72/7612* (2026.01)

(58) Field of Classification Search
CPC ......... H01L 21/68742; H01L 21/67017; H01L 21/67051; H01L 21/6719; H01L 21/67253; B08B 3/04; H10P 72/0402; H10P 72/0414; H10P 72/0462; H10P 72/0604; H10P 72/7612
See application file for complete search history.

(56) References Cited

U.S. PATENT DOCUMENTS

| | | | |
|---|---|---|---|
| 11,655,907 B2 | 5/2023 | Choi et al. | |
| 2019/0096717 A1* | 3/2019 | Lee ................... | H01L 21/68742 |
| 2022/0205718 A1* | 6/2022 | Lee ........................ | F26B 5/005 |

(Continued)

FOREIGN PATENT DOCUMENTS

| | | | | |
|---|---|---|---|---|
| JP | 2002506489 A * | 2/2002 | ....... | H01L 21/68721 |
| JP | 2013-033815 | 2/2013 | | |

(Continued)

OTHER PUBLICATIONS

Notice of Allowance from the Korean Intellectual Property Office dated Feb. 5, 2025.

*Primary Examiner* — Benjamin L Osterhout

(57) ABSTRACT

Provided is a substrate processing apparatus including a body having a substrate treatment space therein, a fluid supply unit configured to supply a treatment fluid to the substrate treatment space, a fluid exhaust line to exhaust the treatment fluid from the substrate treatment space, a clamp body configured to surround and fix the body, a friction prevention member arranged between the body and the clamp body and configured to prevent friction between the body and the clamp body, a conductor extending along at least a portion of an outer rim of the friction prevention member, and a processor configured to detect whether the conductor has been deformed, based on an output signal that is output in response to an electrical signal applied to the conductor.

20 Claims, 10 Drawing Sheets

(56) References Cited

U.S. PATENT DOCUMENTS

| 2022/0305536 | A1* | 9/2022 | Lee | .................. | H01L 21/67028 |
|---|---|---|---|---|---|
| 2023/0035940 | A1 | 2/2023 | Lee et al. | | |

FOREIGN PATENT DOCUMENTS

| KR | 10-1347117 | | 1/2014 | | |
|---|---|---|---|---|---|
| KR | 10-2018-0134179 | | 12/2018 | | |
| KR | 10-2020-0121104 | | 10/2020 | | |
| KR | 10-2233466 | | 3/2021 | | |
| KR | 20210103124 | A * | 8/2021 | ....... | H01L 21/67242 |
| KR | 20220097730 | A * | 7/2022 | ............. | F26B 5/005 |
| KR | 10-2023-0019295 | | 2/2023 | | |
| KR | 20230075113 | A * | 5/2023 | ......... | H01L 21/6875 |
| TW | 202306016 | A * | 2/2023 | ....... | H01L 21/68742 |

* cited by examiner

SUBSTRATE PROCESSING APPARATUS

CROSS-REFERENCE TO RELATED APPLICATION

This application is based on and claims priority under 35 U.S.C. § 119 to Korean Patent Application No. 10-2022-0185900, filed on Dec. 27, 2022, in the Korean Intellectual Property Office, the disclosure of which is incorporated by reference herein in its entirety.

BACKGROUND

1. Field

The disclosure relates to a substrate processing apparatus, and more particularly, to a substrate processing apparatus including a chamber wherein a substrate is cleaned.

2. Description of the Related Art

In order to manufacture a semiconductor device, various processes, such as photolithography, etching, ashing, ion implantation, and thin-film deposition, are performed to form a desired pattern on a substrate such as a wafer. Various treatment liquids and treatment gases are used in each process, and particles and process by-products are formed during these processes. A cleaning process is performed before and after each process to remove such particles and process by-products from the substrate.

Recently, a supercritical drying process is used for supplying an organic solvent such as isopropyl alcohol (IPA) onto a substrate to replace a rinsing liquid remaining on the substrate with the organic solvent having a low surface tension, and then, supplying a treatment fluid in a supercritical state onto the substrate to remove the organic solvent remaining on the substrate. In the supercritical drying process, a drying gas is supplied to a process chamber having a sealed inner space, and the drying gas is heated and pressurized. Accordingly, both the temperature and pressure of the drying gas rise above critical values, and the drying gas undergoes a phase change to a supercritical state.

SUMMARY

Provided is a substrate processing apparatus capable of efficiently treating a substrate.

Provided is a substrate processing apparatus capable of detecting deformation of a friction prevention member.

Additional aspects will be set forth in part in the description which follows and, in part, will be apparent from the description, or may be learned by practice of the presented embodiments of the disclosure.

According to an aspect of the disclosure, a substrate processing apparatus includes a body having a substrate treatment space therein, a fluid supply unit configured to supply a treatment fluid to the substrate treatment space, a fluid exhaust line to exhaust the treatment fluid from the substrate treatment space, a clamp body configured to surround and fix the body, a friction prevention member arranged between the body and the clamp body and configured to prevent friction between the body and the clamp body, a conductor extending along at least a portion of an outer rim of the friction prevention member, and a processor configured to detect whether the conductor has been deformed, based on an output signal output in response to an electrical signal applied to the conductor.

According to an embodiment, the body includes an upper body, and a lower body that moves relative to the upper body, and the friction prevention member prevents friction between the upper body and the clamp body and between the lower body and the clamp body.

According to an embodiment, the processor includes an electrical sensor configured to detect an output signal output from the conductor, one end of the conductor is connected to a positive terminal of the electrical sensor, and another end of the conductor is connected to a negative terminal of the electrical sensor.

According to an embodiment, the processor further includes a deformation determination unit configured to determine whether the conductor has been deformed, based on the output signal detected by the electrical sensor.

According to an embodiment, the processor further includes a deformation indication unit configured to receive, from the deformation determination unit, information about whether the conductor has been deformed, and notify that the conductor has been deformed.

According to an embodiment, the friction prevention member includes a first part extending in a direction, a second part extending in an upward direction from the first part to intersect the direction in which the first part extends, and a third part extending in a downward direction from the first part to intersect the direction in which the first part extends.

According to an embodiment, the second part and the third part are arranged to alternate with each other in the direction in which the first part extends.

According to an embodiment, in the friction prevention member, the first part, the second part, and the third part are formed into one body.

According to an embodiment, in the friction prevention member, the first part, the second part, and the third part are formed into one body.

According to an embodiment, the conductor includes a wire having a diameter of about 0.05 mm to about 0.15 mm.

According to an embodiment, the friction prevention member includes a polyimide film.

According to another aspect of the disclosure, a substrate processing apparatus includes a chamber body including a first body and a second body, which is formed to be movable relative to the first body, and has a substrate treatment space therein, a clamp body to fix the first body and the second body when the first body and the second body are at closing position at which the first body and the second body are in close contact with each other, a friction prevention member attached to the clamp body and configured to prevent friction between the chamber body and the clamp body, a conductor buried in the friction prevention member, and a processor configured to detect whether the conductor has been deformed, based on an output signal output in response to an electrical signal applied to the conductor.

According to an embodiment, the friction prevention member extends in a first direction, and the conductor extends along an edge of the friction prevention member.

According to an embodiment, the friction prevention member includes a first part extending in a direction, and a second part extending from the first part to intersect the direction in which the first part extends.

According to an embodiment, the conductor extends along edges of the first part and the second part.

According to an embodiment, the conductor is buried in the first part and formed in a U shape.

According to an embodiment, a plurality of friction prevention members are arranged to be spaced apart from each other.

According to an embodiment, in a top view, some of the plurality of friction prevention members are arranged to be spaced apart from each other in a circumferential direction.

According to an embodiment, the friction prevention member includes a polyimide film.

According to another aspect of the disclosure, a substrate processing apparatus includes a chamber body including a first body and a second body, which is formed to be movable relative to the first body, and has a substrate treatment space therein, a fluid supply unit configured to supply a treatment fluid to the substrate treatment space, a fluid exhaust line to exhaust the treatment fluid from the substrate treatment space, a clamp body to fix the first body and the second body when the first body and the second body are at closing position at which the first body and the second body are in close contact with each other, a friction prevention member attached to the clamp body and configured to prevent friction between the chamber body and the clamp body, a conductor installed along an outer rim of the friction prevention member, a processor configured to detect whether the conductor has been deformed, based on an output signal output in response to an electrical signal applied to the conductor, wherein the friction prevention member includes a first part extending lengthwise in a direction, a second part extending in an upward direction from the first part to intersect the direction in which the first part extends, and a third portion extending in a downward direction from the first part to intersect the direction in which the first part extends, the first part, the second part, and the third part are formed into one body, a plurality of friction prevention members are provided to be spaced apart from each other, some of the plurality of friction prevention members are arranged to be spaced apart from each other in a circumferential direction in a top view, the conductor includes a wire having a diameter of about 0.05 mm to about 0.15 mm, and the plurality of friction prevention members each include a polyimide film.

According to an embodiment, the processor includes an electrical sensor configured to detect an output signal that is output from the conductor, a deformation determination unit configured to determine whether the conductor has been deformed, based on the output signal detected by the electrical sensor, and a deformation indication unit configured to receive, from the deformation determination unit, information about whether the conductor has been deformed, and notify that the conductor has been deformed, one end of the conductor is connected to a positive terminal of the electrical sensor, and another end of the conductor is connected to a negative terminal of the electrical sensor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
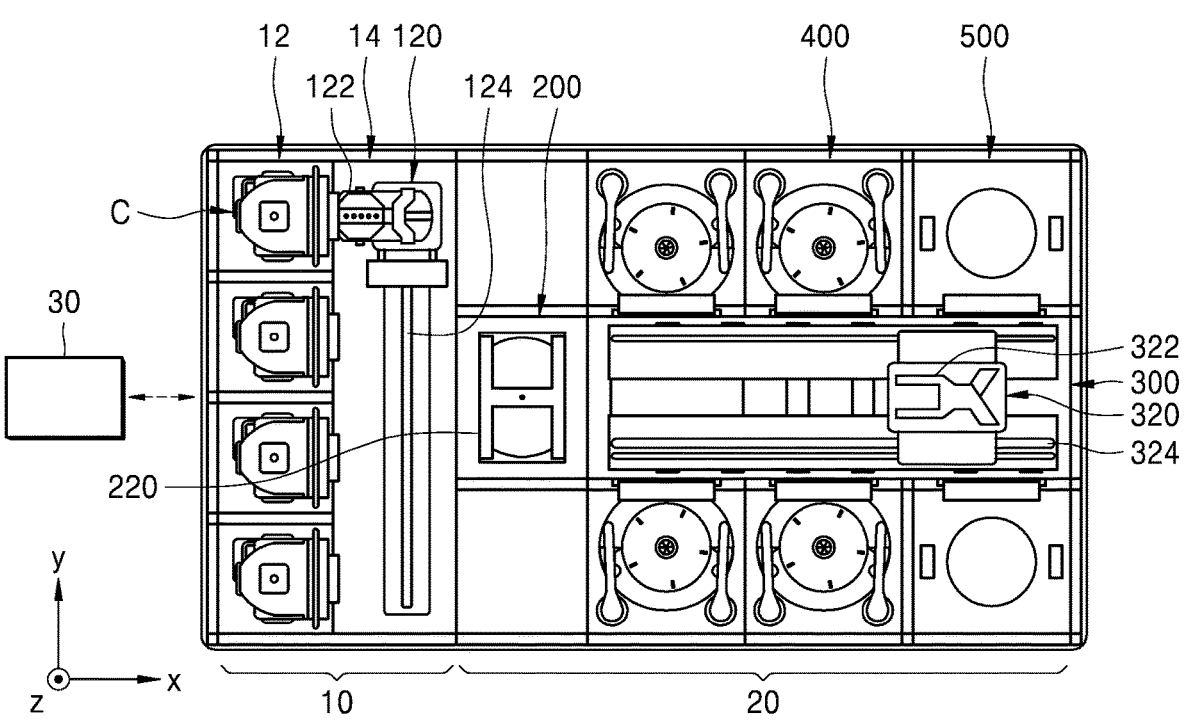
FIG. 1 is a plan view illustrating a substrate processing apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Hereinafter, embodiments will be described in detail with reference to the accompanying drawings to allow those of skill in the art to easily carry out the embodiments. The disclosure may, however, be embodied in many different forms and should not be construed as being limited to the embodiments set forth herein. In addition, in describing preferred embodiments in detail, when the detailed description of the relevant known functions or configurations is determined to unnecessarily obscure the gist of the disclosure, the detailed description will be omitted. In addition, the same reference numerals are used throughout the drawings for elements having similar functions and actions.

When an element is referred to as 'including' a component, the element may additionally include other components rather than excluding other components as long as there is no particular opposing recitation.

In detail, terms such as "comprises," "includes," or "has" specify the presence of stated features, numbers, stages, operations, components, parts, or a combination thereof, but do not preclude the presence or addition of one or more other features, numbers, stages, operations, components, parts, or a combination thereof.

FIG. 1 is a plan view illustrating a substrate processing apparatus according to an embodiment.

Referring to FIG. 1, the substrate processing apparatus may include an index module 10, a processing module 20, and a controller 30. When viewed from above, the index module 10 and the processing module 20 may be arranged in one direction. Hereinafter, the direction in which the index module 10 and the processing module 20 are arranged is referred to as a first direction (x direction), the direction perpendicular to the first direction (x direction) when viewed from above is referred to as a second direction (y direction), and the direction perpendicular to both the first direction (x direction) and the second direction (y direction) is referred to as a third direction (z direction).

The index module 10 may transfer a substrate W from a container C in which the substrate W is accommodated to the processing module 20, and accommodate, into the container C, the substrate W that has been completely treated in the processing module 20. The index module 10 is provided such that the lengthwise direction thereof is the second direction (y direction). The index module 10 may have a load port 12 and an index frame 14. The load port 12 may be positioned on the opposite side to the processing module 20 with respect to the index frame 14. The container C in which the substrates W are accommodated is placed on the load port 12. A plurality of load ports 12 may be provided, and the plurality of load ports 12 may be arranged in the second direction (y direction).

As the container C, an airtight container such as a front-opening unified pod (FOUP) may be used. The container C may be placed on the load port 12 by an operator or a transfer unit (not shown) such as an overhead transfer unit, an overhead conveyor, or an automatic guided vehicle.

An index robot 120 is provided in the index frame 14. A guide rail 124 is provided in the index frame 14 in the second direction (y direction), and the index robot 120 may be provided to be movable on the guide rail 124. The index robot 120 may include a hand 122 on which the substrate W is placed, and the hand 122 may be provided to be able to move forward and backward, rotate about the third direction (z direction), and move in the third direction (z direction). A plurality of hands 122 may be arranged spaced apart from each other in the vertical direction, and the hands 122 may move forward and backward independently of each other.

The controller 30 may control the substrate processing apparatus. The controller 30 may include a processor controller consisting of a microprocessor (e.g., a computer) for executing control of the substrate processing system, a keyboard for an operator to perform a command input manipulation and the like to manage the substrate processing system, a user interface consisting of a display and the like for visualizing and displaying an operation situation of the substrate processing system, and a storage unit storing control programs and various types of data for the substrate processing system to execute a process under control by a process controller, and programs, that is, processing recipes, for executing a process in each component according to a processing condition. Also, the user interface and the storage unit may be connected to the process controller. The processing recipes may be stored in a storage medium in the storage unit, and the storage medium may be a hard disk, a portable disk such as a compact disc read-only memory (CD-ROM) or a digital video disc (DVD), or a semiconductor memory such as flash memory.

The processing module 20 may include a buffer unit 200, a transfer chamber 300, a liquid treatment chamber 400, and a substrate processing apparatus 500. The buffer unit 200 provides a space in which the substrate W loaded to the processing module 20 and the substrate W unloaded from the processing module 20 temporarily stay. The liquid treatment chamber 400 performs a liquid treatment process of liquid-treating the substrate W by supplying a liquid onto the substrate W. The substrate processing apparatus 500 performs a drying process of removing the liquid remaining on the substrate W. The transfer chamber 300 transfers the substrate W between the buffer unit 200, the liquid treatment chamber 400, and the substrate processing apparatus 500.

The transfer chamber 300 may be provided such that the lengthwise direction thereof is the first direction (x direction). The buffer unit 200 may be arranged between the index module 10 and the transfer chamber 300. The liquid treatment chamber 400 and the substrate processing apparatus 500 may be arranged in lateral portions of the transfer chamber 300. The liquid treatment chamber 400 and the transfer chamber 300 may be arranged in the second direction (y direction). The substrate processing apparatus 500 and the transfer chamber 300 may be arranged in the second direction (y direction). The buffer unit 200 may be positioned at one end of the transfer chamber 300.

According to an embodiment, the liquid treatment chambers 400 may be arranged on both sides of the transfer chamber 300, the substrate processing apparatuses 500 may arranged on both sides of the transfer chamber 300, and the liquid treatment chambers 400 may be arranged closer to the buffer unit 200 than the substrate processing apparatuses 500. On one side of the transfer chamber 300, the liquid treatment chambers 400 may be provided in an arrangement of A×B (where each of A and B is a natural number of 1 or greater) in the first direction (x direction) and the third direction (z direction). In addition, on one side of the transfer chamber 300, C×D (where each of C and D is a natural number of 1 or greater) substrate processing apparatuses 500 may be provided in the first direction (x direction) and the third direction (z direction), respectively. Unlike the above description, only the liquid treatment chamber 400 may be provided on one side of the transfer chamber 300 and only the substrate processing apparatus 500 may be provided on the other side.

The transfer chamber 300 has a transfer robot 320. A guide rail 324 may be provided in the transfer chamber 300 such that the lengthwise direction thereof is the first direction (x direction), and the transfer robot 320 may be provided to be movable on the guide rail 324. The transfer robot 320 may include a hand 322 on which the substrate W is placed, and the hand 322 may be provided to be able to move forward and backward, rotate about the third direction (z direction), and move in the third direction (z direction). A plurality of hands 322 may be arranged spaced apart from each other in the vertical direction, and the hands 322 may move forward and backward independently of each other.

The buffer unit 200 includes a plurality of buffers 220 on which the substrate W is placed. The buffers 220 may be arranged to be spaced apart from each other in the third direction (z direction). The front face and the rear face of the buffer unit 200 are open. The front face is a face facing the index module 10, and the rear face is a face facing the transfer chamber 300. The index robot 120 may approach the buffer unit 200 through the front face, and the transfer robot 320 may approach the buffer unit 200 through the rear face.

Figure 2:
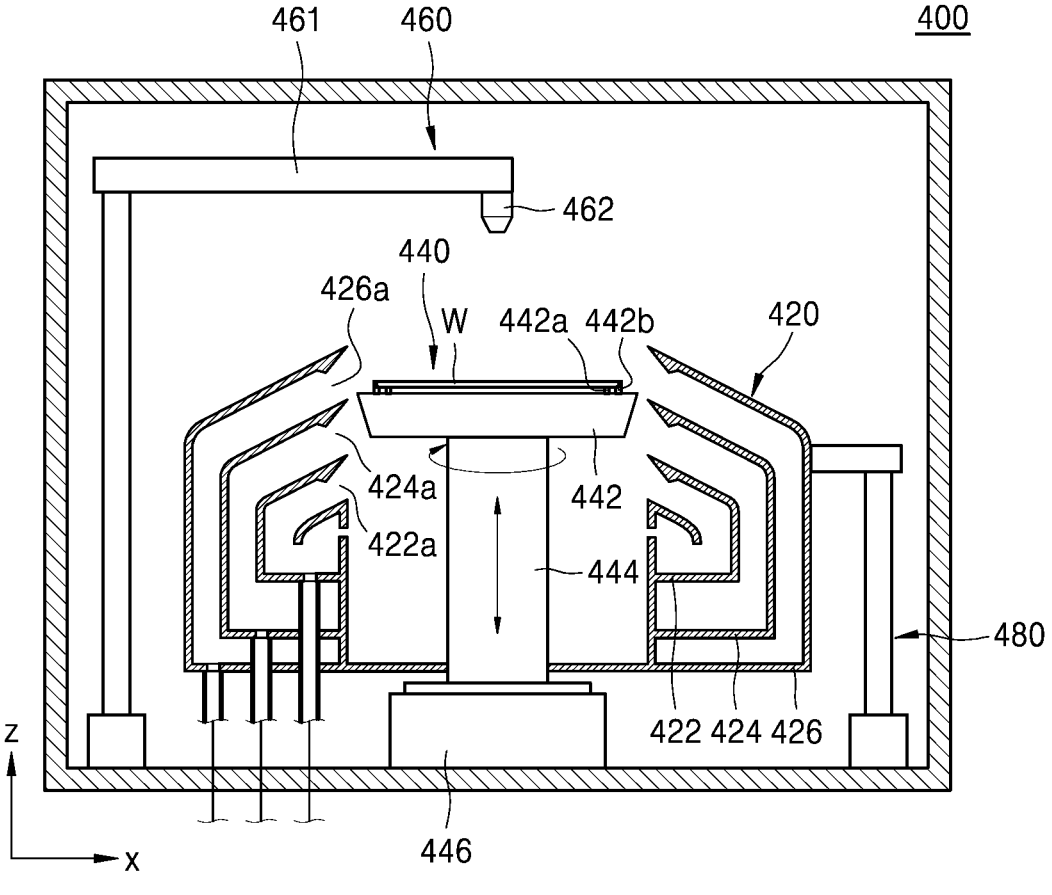
FIG. 2 is a cross-sectional view schematically illustrating a liquid treatment chamber illustrated in FIG. 1.

FIG. 2 is a cross-sectional view schematically illustrating the liquid treatment chamber illustrated in FIG. 1.

Referring to FIG. 2, the liquid treatment chamber 400 may include a housing 410, a cup 420, a support unit 440, a liquid supply unit 460, and a lifting unit 480. The housing 410 may have an inner space in which the substrate W is treated. The housing 410 may have a substantially hexahedral shape. For example, the housing 410 may have a rectangular parallelepiped shape. In addition, an opening (not shown) through which the substrate W is loaded or unloaded may be formed in the housing 410. In addition, a door (not shown) may be installed in the housing 410 to selectively open and close the opening.

The cup 420 may have a cylindrical shape with an open top. The cup 420 has a treatment space, and the substrate W may be liquid-treated in the treatment space. The support unit 440 supports the substrate W in the treatment space. The liquid supply unit 460 supplies a treatment liquid onto the substrate W supported by the support unit 440. A plurality of types of treatment liquids may be provided and sequentially supplied onto the substrate W. The lifting unit 480 may adjust the relative height between the cup 420 and the support unit 440.

According to an embodiment, the cup 420 has a plurality of collection containers 422, 424, and 426. Each of the collection containers 422, 424, and 426 includes a collection space for collecting a liquid used in substrate treatment. Each of the collection containers 422, 424, and 426 is provided in a ring shape surrounding the support unit 440. The treatment liquid scattered by rotation of the substrate W during the liquid treatment process flows into the collection space through inlets 422a, 424a, and 426a of the respective collection containers 422, 424, and 426. According to an embodiment, the cup 420 has a first collection container 422, a second collection container 424, and a third collection container 426. The first collection container 422 is arranged to surround the support unit 440, the second collection container 424 is arranged to surround the first collection container 422, and the third collection container 426 is arranged to surround the second collection container 426. A second inlet 424a for introducing a liquid into the second collection container 424 may be positioned above a first inlet port 422a for introducing a liquid into the first collection container 422, and a third inlet 426a for introducing a liquid into the third collection container 426 may be positioned above the second inlet 424a.

The support unit 440 has a support plate 442 and a drive shaft 444. The upper surface of the support plate 442 may be provided in a substantially circular shape, and may have a diameter greater than that of the substrate W. A support pin 442a is formed at the center of the support plate 442 to support the rear surface of the substrate W, and the support pin 442a is provided such that the upper end thereof protrudes from the support plate 442 to allow the substrate W to be spaced apart from the support plate 442 by a preset distance. A chuck pin 442b is provided at an edge of the support plate 442. The chuck pin 442b is provided to protrude upward from the support plate 442, and supports a lateral portion of the substrate W to prevent the substrate W from being separated from the support unit 440 when the substrate W is rotated. The drive shaft 444 is driven by a driver 446, is connected to the center of the lower surface of the substrate W, and rotates the support plate 442 about the central axis of the drive shaft 444.

According to an embodiment, the liquid supply unit 460 may include a nozzle 462. The nozzle 462 may supply the treatment liquid to the substrate W. The treatment liquid may be a chemical, a rinsing liquid, or an organic solvent. The chemical may be a chemical with strong acid properties or strong base properties. In addition, the rinsing liquid may be pure water. Also, the organic solvent may be isopropyl alcohol (IPA). In addition, the liquid supply unit 460 may include a plurality of nozzles 462, which may supply different types of treatment liquids. For example, any one of the nozzles 462 may supply a chemical, another of the nozzles 462 may supply a rinsing liquid, and still another one of the nozzles 462 may supply an organic solvent. In addition, the controller 30 may control the liquid supply unit 460 such that, after the other one of the nozzles 462 supplies the rinsing liquid to the substrate W, the still other one of the nozzles 462 supplies the organic solvent. Accordingly, the rinsing liquid supplied onto the substrate W may be replaced with the organic solvent having a low surface tension. The lifting unit 480 moves the cup 420 in the vertical direction. The relative height between the cup 420 and the substrate W is changed by the vertical movement of the cup 420. Accordingly, the collection containers 422, 424, and 426 for collecting treatment liquids are changed according to the types of liquids supplied onto the substrate W, and thus, the liquids may be separated and collected. Unlike the above description, the cup 420 may be fixedly installed, and the lifting unit 480 may move the support unit 440 in the vertical direction.

Figure 3:
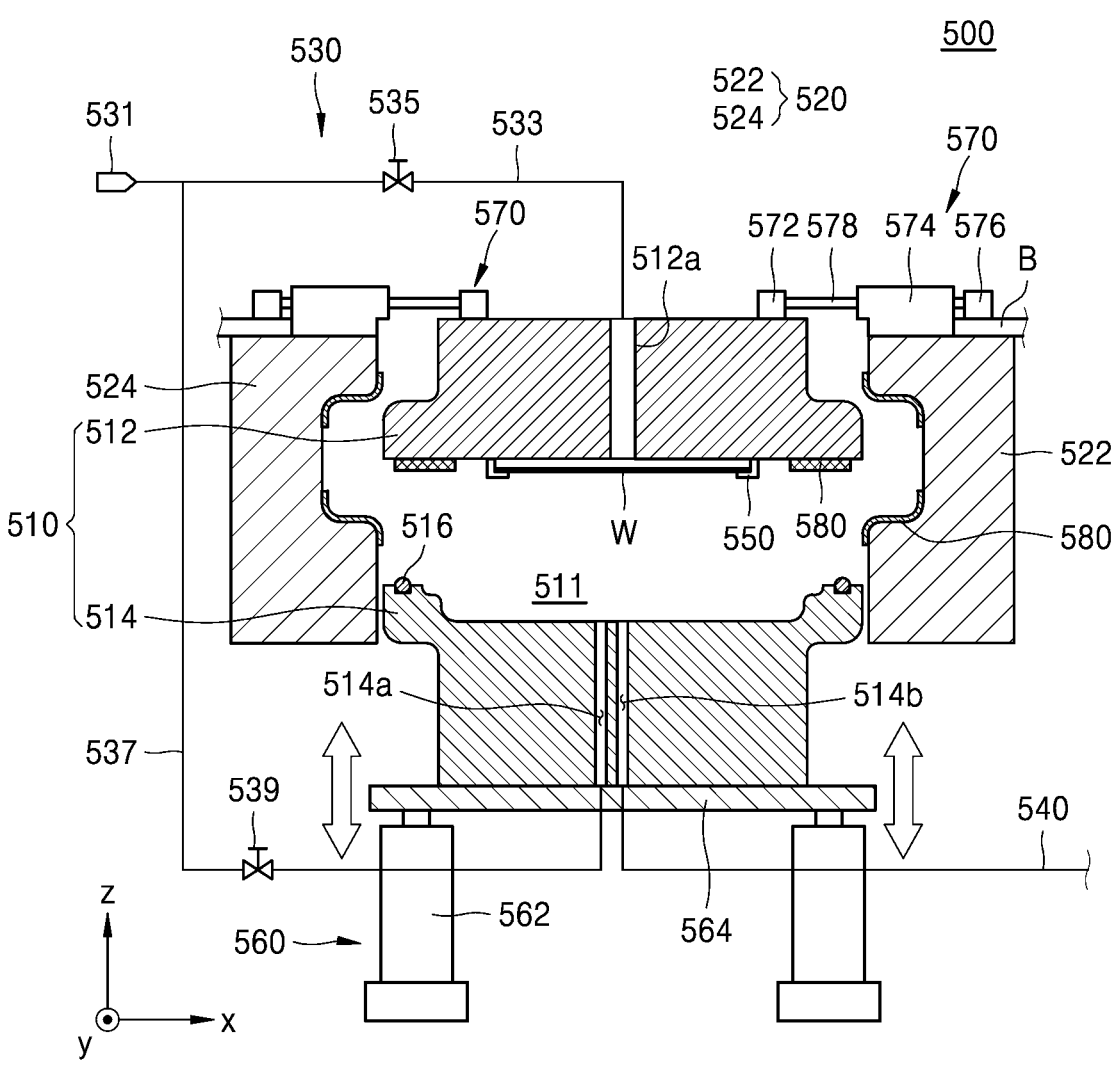
FIG. 3 is a cross-sectional view schematically illustrating a drying chamber illustrated in FIG. 1.

FIG. 3 is a cross-sectional view schematically illustrating the drying chamber illustrated in FIG. 1.

Referring to FIG. 3, the substrate processing apparatus 500 according to an embodiment may remove a treatment liquid remaining on the substrate W, by using a drying fluid in a supercritical state. For example, the substrate processing apparatus 500 may perform a drying process of removing an organic solvent remaining on the substrate W by using carbon dioxide ($CO_2$) in a supercritical state.

The substrate processing apparatus 500 may include a chamber body 510 (an example of a first body), a clamp body 520 (an example of a second body), a fluid supply unit 530, a fluid exhaust line 540, a support member 550, a first moving unit 560, a second moving unit 570, and a friction prevention member 580. The chamber body 510 and the clamp body 520 may be collectively referred to as 'body'.

The chamber body 510 may include an upper body 512 (another example of the first body) and a lower body 514 (another example of the second body). The upper body 512 and the lower body 514 may be combined with each other to form a treatment space 511. Any one of the upper body 512 and the lower body 514 may be configured to be relatively movable with respect to the other one. For example, any one of the upper body 512 and the lower body 514 may be moved by the first moving unit 560. The first moving unit 560 may include a lifting driver 562 and a lifting plate 564. A plurality of lifting drivers 562 may be provided and may be connected to the lifting plate 564. The lifting plate 564 may be coupled to the lower body 514. When the lifting driver 562 lifts the lifting plate 564, the lower body 514 may also be lifted together with the lifting plate 564. A heater for heating the drying fluid supplied to the treatment space 511 may be buried in the chamber body 510. In addition, a groove is formed in the lower body 514 to increase the airtightness of the inner space 511 when the upper body 512 and the lower body 514 are in closing positions, and an O-ring 516 as a sealing member may be inserted into the groove.

The position of the upper body 512 may be fixed, and the lower body 514 may be lifted in the third direction (z direction) by the first moving unit 560. Hereinafter, a position at the lower body 514 ascends and comes into contact with the upper body 512 to form the treatment space 511 is referred to as a closing position, and a position at which the lower body 514 descends and is spaced apart from the upper body 512 is referred to as an opening position.

The clamp body 520 may include a first clamp body 522 and a second clamp body 524. The first clamp body 522 and the second clamp body 524 may fix the chamber body 510 at positions opposite to each other. The inner surfaces of the first clamp body 522 and the second clamp body 524 may have shapes substantially corresponding to the outer surfaces of the chamber body 510 in the closing position. The first clamp body 522 and the second clamp body 524 may be moved by the second moving unit 570. A plurality of second moving units 570 may be provided. Any one of the second moving units 570 may be connected to the upper body 512 and the first clamp body 522, and another one of the second moving units 570 may be connected to the upper body 512 and the second clamp body 524.

The second moving unit 570 may include a first body 572 coupled to the upper body 512, a second body 574, which is coupled to the clamp body 520 and is moved along a moving rail 578, and a third body 576 coupled to a fixed outer wall B. The second body 574 may move the clamp body 520 in a direction toward the chamber body 510, while moving in the first direction (x direction).

The fluid supply unit 530 may supply a drying fluid to the treatment space 511. The drying fluid supplied by the fluid supply unit 530 may include carbon dioxide ($CO_2$). The fluid supply unit 530 may include a fluid supply source 531, a first supply line 533, a first supply valve 535, a second supply line 537, and a second supply valve 539.

The fluid supply source 531 may store and/or supply the drying fluid to be supplied to the treatment space 511. The fluid supply source 531 may supply the drying fluid to the first supply line 533 and/or the second supply line 537. For example, the first supply valve 535 may be installed in the first supply line 533. In addition, the first supply line 533 may be connected to a first supply channel 512a formed in the upper body 512. In addition, the second supply valve 539 may be installed in the second supply line 537. Also, the second supply line 537 may be connected to a second supply channel 514a formed in the lower body 514. The first supply valve 535 and the second supply valve 539 may be on/off valves. The drying fluid may selectively flow through the first supply line 533 or the second supply line 537 according to on/off of the first supply valve 535 and the second supply valve 539.

An example described above in which the first supply line 533 and the second supply line 537 are connected to one fluid supply source 531, but the disclosure is not limited thereto. For example, a plurality of fluid supply sources 531 may be provided, the first supply line 533 may be connected to any one of the plurality of fluid supply sources 531, and the second supply line 537 may be connected to another one of the fluid supply sources 531.

In addition, the first supply line 533 may be an upper supply line for supplying the drying gas above the treatment space 511. For example, the first supply line 533 may supply the drying gas to the treatment space 511 in a downward direction. Also, the second supply line 537 may be a lower supply line for supplying the drying gas below the treatment space 511. For example, the second supply line 537 may supply the drying gas to the treatment space 511 in an upward direction.

The fluid exhaust line 540 may exhaust the drying fluid from the treatment space 511. The fluid exhaust line 540 may be connected to a depressurizing member (not shown) that provides depressurization to the treatment space. In addition, the fluid exhaust line 540 may be connected to an exhaust channel 514b formed in the lower body 514. The depressurizing member may be a pump. However, the disclosure is not limited thereto, and the depressurizing member may be variously modified into a known device capable of providing depressurization to the treatment space.

The support member 550 may support the substrate W in the treatment space 511. The support member 550 may support an edge of the substrate W in the treatment space 511. The support member 550 may support the lower surface of the edge of the substrate W. The support member 550 may be installed in the upper body 512.

The friction prevention member 580 may be installed in the clamp body 520. The friction prevention member 580 may be installed on the inner surface of the clamp body 520. The friction prevention member 580 may be installed in an area in which the clamp body 520 and the chamber body 510 may come into contact with each other, that is, a contact surface. The friction prevention member 580 may also be referred to as a friction prevention film. A plurality of friction prevention members 580 may be provided. Some of the friction prevention members 580 may be installed in lower portions of the inner surface of the clamp body 520, and the other of the friction prevention members 580 may be installed in upper portion of the inner surface of the clamp body 520.

According to an embodiment, the friction prevention member 580 may include a polyimide film. Polyimide materials do not swell in supercritical fluids.

The friction prevention member 580 may be installed in each of the first clamp body 522 and the second clamp body 524. Two friction prevention members 580 may be installed in lower portions of the inner surface of the first clamp body 522, and two friction prevention members 580 may be installed upper portions of the inner surface of the first clamp body 522. Similarly, two friction prevention members 580 may be installed in lower portions of the inner surface of the second clamp body 524, and two friction prevention members 580 may be installed upper portions of the inner surface of the second clamp body 524. That is, the friction prevention members 580 may be installed at eight points. The installation position and specific shape of the friction prevention member 580 will be described below.

In addition, the friction prevention member 580 may be attached to the upper body 512 to prevent friction between the lower body 514 and the upper body 512. In detail, the friction prevention member 580 may be attached to the upper surface of an outer portion of the upper body 512 that may come into contact with the lower body 514. Although FIG. 3 illustrates that the friction prevention members 580 are attached to outer portions of the upper body 512, but the disclosure is not limited thereto, and the friction prevention members 580 may be attached to the upper surface of outer portions of the lower body 514.

Figure 4:
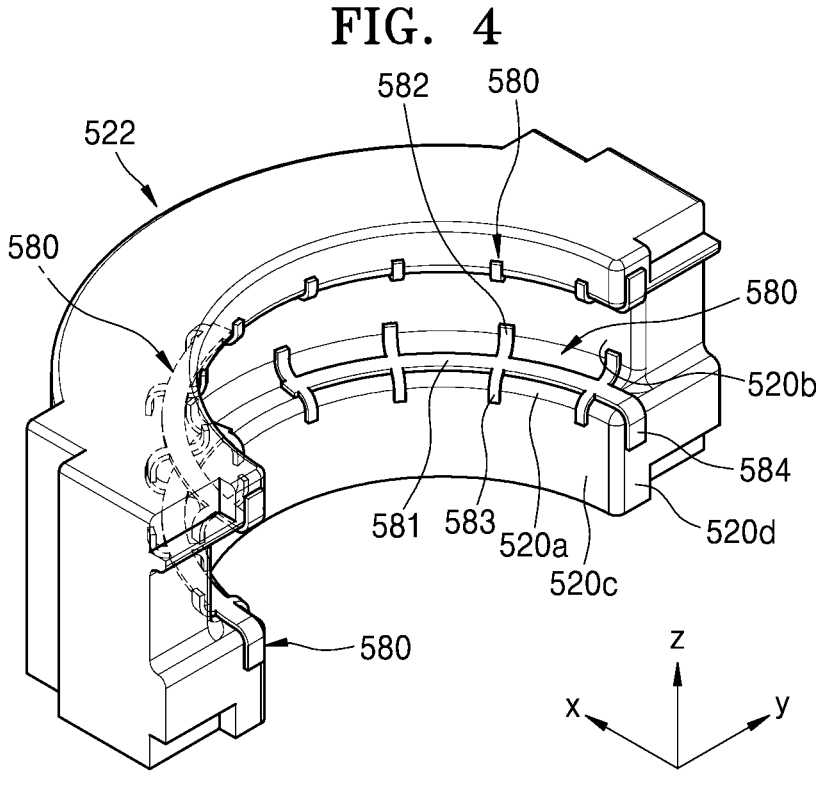
FIG. 4 is a perspective view illustrating one of clamp bodies of FIG. 3.
Figure 5:
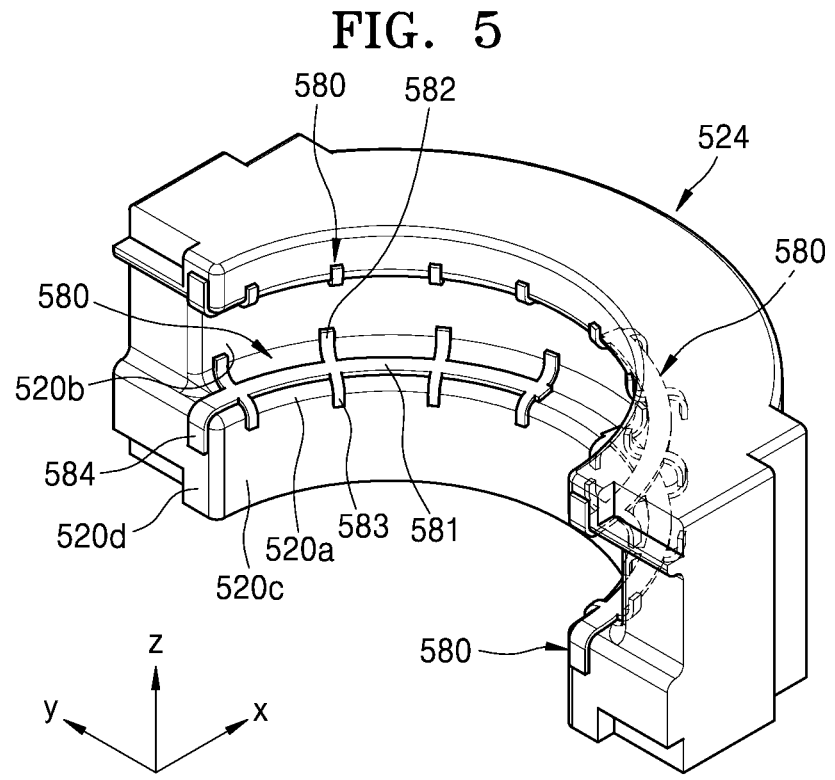
FIG. 5 is a perspective view illustrating another one of the clamp bodies of FIG. 3.
Figure 6:
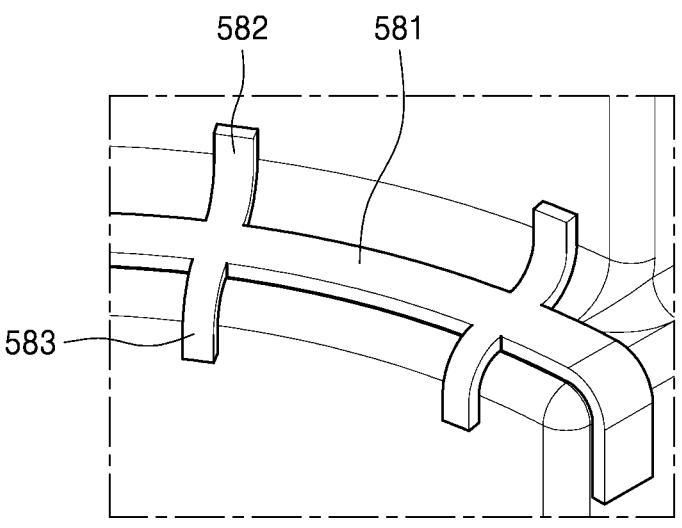
FIG. 6 is an enlarged view of a portion of a chamber body and the clamp body of FIG. 5.

FIG. 4 is a perspective view illustrating any one of the clamp bodies of FIG. 3, FIG. 5 is a perspective view illustrating another one of the clamp bodies of FIG. 3, and FIG. 6 is an enlarged view of a portion of the chamber body and the clamp body of FIG. 5. Hereinafter, descriptions will be provided with reference to FIG. 3 together.

Referring to FIGS. 4, 5, and 6, the outer surface of the chamber body 510 may have a shape corresponding to the inner surface of the clamp body 520 when the upper body 512 and the lower body 514 are in closing positions in close contact with each other. For example, when the upper body 512 and the lower body 514 are in the closing positions, a portion of the outer surface of the chamber body 510 may be fixed by the inner surface of the first clamp body 522, and another portion of the outer surface of the chamber body 510 may be fixed by the inner surface of the second clamp body 524.

The friction prevention member 580 may be installed on the inner surface of the first clamp body 522. The friction prevention member 580 may be installed on the inner surface of the second clamp body 524. The friction prevention members 580 may be attached to the inner surfaces of the first clamp body 522 and the second clamp body 524 by an adhesive or the like. However, the disclosure is not limited thereto, and the friction prevention members 580 may be coupled to the inner surface of the clamp body 520 by coupling mechanisms such as bolts/screws.

A plurality of friction prevention members 580 may be installed on the inner surface of the first clamp body 522. The friction prevention members 580 installed on the inner surface of the first clamp body 522 may be installed to be spaced apart from each other. The friction prevention members 580 may be compressed when the first clamp body 522 is in a fixed position (i.e., a position in which the first clamp body 522 is in close contact with the chamber body 510 in the closing position), and the intervals between the friction prevention members 580 may be arranged at intervals not to interfere with each other even when the friction prevention members 580 are compressed. In addition, a plurality of friction prevention members 580 (e.g., two friction prevention members 580) may be installed in lower portions of the inner surface of the first clamp body 522 to be spaced apart from each other. In addition, a plurality of friction prevention members 580 (e.g., two friction prevention members 580) may be installed in upper portions of the inner surface of the first clamp body 522 to be spaced apart from each other. When viewed from above, the friction prevention members 580 may be spaced apart from each other in the circumferential direction. For example, when viewed from above, two friction prevention members 580 arranged in upper portions of the inner surface of the first clamp body 522 may be spaced apart from each other in the circumferential direction. In addition, when viewed from above, two friction prevention members 580 arranged in lower portions of the inner surface of the first clamp body 522 may be spaced apart from each other in the circumferential direction. The arrangement of the friction prevention members 580 installed in the second clamp body 524 is symmetrical with the arrangement of the friction prevention members 580 installed in the first clamp body 522, and thus, redundant descriptions will be omitted.

In addition, each of the inner surfaces of the first clamp body 522 and the second clamp body 524 may include a first surface 520a, second surfaces 520b and 520c, and a third surface 520d. The first surface 520a may be a surface parallel to the ground. The second surfaces 520b and 520c may be surfaces extending from the first surface 520a. The second surfaces 520b and 520c may be surfaces extending in a direction intersecting the direction in which the first surface 520a extends. For example, the second surfaces 520b and 520c may be surfaces extending in a direction perpendicular to the direction in which the first surface 520a extends. The third surface 520d may be a surface extending from the first surface 520a and the second surface 520c. The third surface 520d may be a surface that extends in a direction perpendicular to the direction in which the first surface 520a extends, and extends in a direction perpendicular to the direction in which the second surface 520c extends.

The friction prevention member 580 may be configured to continuously cover two or more inner surfaces of the clamp body 520.

For example, the friction prevention member 580 may include a first part 581, a second part 582, a third part 583, and a fourth part 584. The first part 581 may be configured to cover the first surface 520a of the clamp body 520. The first part 581 may have an arc shape when viewed from above.

The second part 582 and the third part 583 may extend from the first part 581. The second part 582 and the third part 583 may extend to intersect the direction in which the first part 581 extends. For example, the second part 582 and the third part 583 may extend in a direction perpendicular to the direction in which the first part 581 extends. The second part 582 and the third part 583 may be configured to cover the second surfaces 520b and 520c. The second part 582 may extend upward, and the third part 583 may extend downward. In addition, a plurality of second parts 582 and a plurality of third parts 583 may be provided, and may be spaced apart from each other. The distance between the second parts 582 and the third parts 583 may be about 15 mm to about 20 mm. In addition, the friction prevention member 580 may further include the fourth part 584 configured to cover the third surface 520d. The fourth part 584 may extend from the first part 581.

Also, the first part 581, the second part 582, the third part 583, and the fourth part 584 of the friction prevention member 580 may be integrally formed. That is, the friction prevention member 580 may have a structure in which the first part 581, the second part 582, the third part 583, and the fourth part 584 are integrally processed into one body, rather than a structure in which several films are separately attached to the inner surface of the clamp body 520. This is because, when several films overlap each other to form the friction prevention member 580 to have the first part 581, the second part 582, the third part 583, and the fourth part 584, it is highly likely that the friction prevention member 580 is damaged due to vibration generated by the pressure of the treatment space 511.

Figure 7:
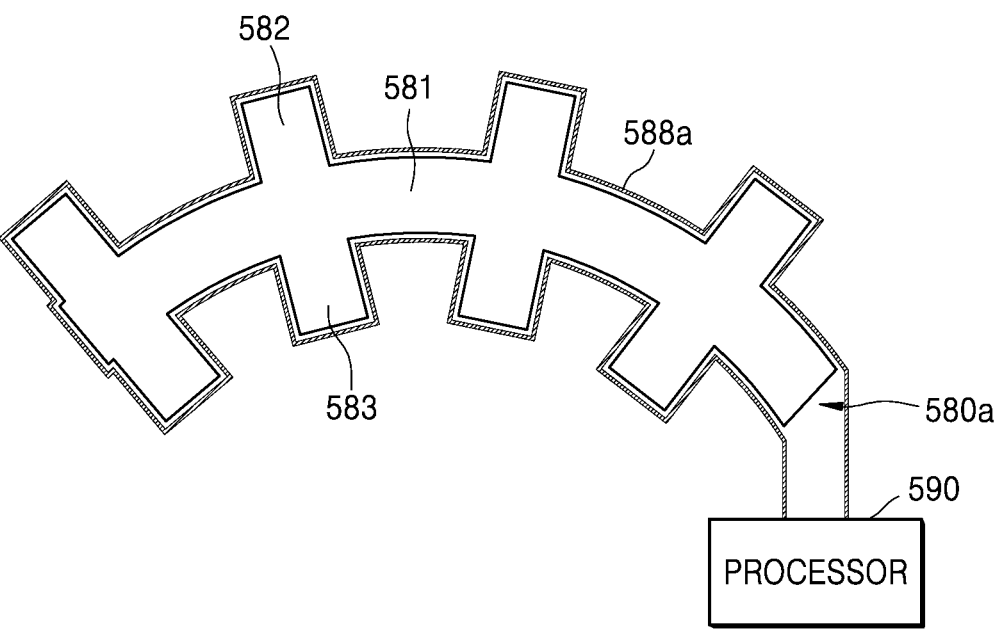
FIG. 7 is a schematic diagram illustrating a friction prevention member provided in a substrate processing apparatus according to an embodiment.

FIG. 7 is a schematic diagram illustrating a friction prevention member provided in a substrate processing apparatus according to an embodiment.

Referring to FIG. 7, a friction prevention member 580a may include the first part 581 extending in one direction and the second part 582 extending upward from the first part 581 to intersect the direction in which the first part 581 extends. In addition, the friction prevention member 580a may include the third part 583 extending in a downward direction from the first part 581 to intersect the direction in which the first part 581 extends. The first part 581 of the friction prevention member 580a may be an area extending to be relatively longer than the second part 582 and the third part 583. Here, the first part 581, the second part 582, and the third part 583 may be formed into one body. Referring to FIG. 4 together, the first part 581 may be attached to the first surfaces 520a of the inner surfaces of the clamp bodies 522 and 524. In addition, the second part 582 and the third part 583 may be attached to the second surfaces 520b and 520c of the inner surfaces of the clamp bodies 522 and 524, respectively. The second part 582 and the third part 583 may have sufficiently long areas not to fall off when bonded to the inner surfaces of the clamp bodies 522 and 524.

According to an embodiment, the substrate processing apparatus 500 may include a conductor 588a extending along at least a portion of an outer rim of the friction prevention member 580a. The conductor 588a may extend along the edges of the entire regions of the second part 582 and the third part 583 of the friction prevention member 580. However, although FIG. 7 illustrates that the conductor 588a does not cover a portion of the right edge of the first part 581, the disclosure is not limited thereto, and the conductor 588a may cover all edges of the first part 581 according to an embodiment. The conductor 588a may include a wire having a certain resistance. Here, the diameter of the conductor 588a may be within a range of 0.05 mm to 0.15 mm, but is not necessarily limited thereto, and may deviate from the above range depending on the size of the friction prevention member 580a.

The substrate processing apparatus may include a processor 590 electrically connected to the conductor 588a. As will be described below, the processor 590 may be configured to detect, from an output signal output in response to an electrical signal applied to the conductor 588a, whether the conductor 588a is deformed. When the friction prevention member 580a is deformed due to high pressure or the like during a process, the conductor 588a is also deformed to output an electrical signal to the processor 590. The electrical signal may refer to a signal indicating that a current flowing along the conductor 588a is interrupted or a signal indicating that a circuit between a positive terminal 591 (see FIG. 17) and a negative terminal 592 (see FIG. 17) of the processor 590 is opened. This is because the deformation of the conductor 588a may mean that the circuit resistance between the positive terminal 591 and the negative terminal 592 of the processor 590 is infinite.

The first part 581 may be an area of the friction prevention member 580a having the lowest width-to-length ratio. In the first part 581, an area between the plurality of second parts 582 or the plurality of third parts 583 may have the lowest width-to-length ratio. An area having a low width-to-length ratio is highly likely to be damaged due to an external force such as pressure applied from the outside. Accordingly, the conductor 588a may be arranged to extend along an edge of the first part 581 between the plurality of second parts 582 or the plurality of third parts 583 of the friction prevention member 580a.

Figure 8:
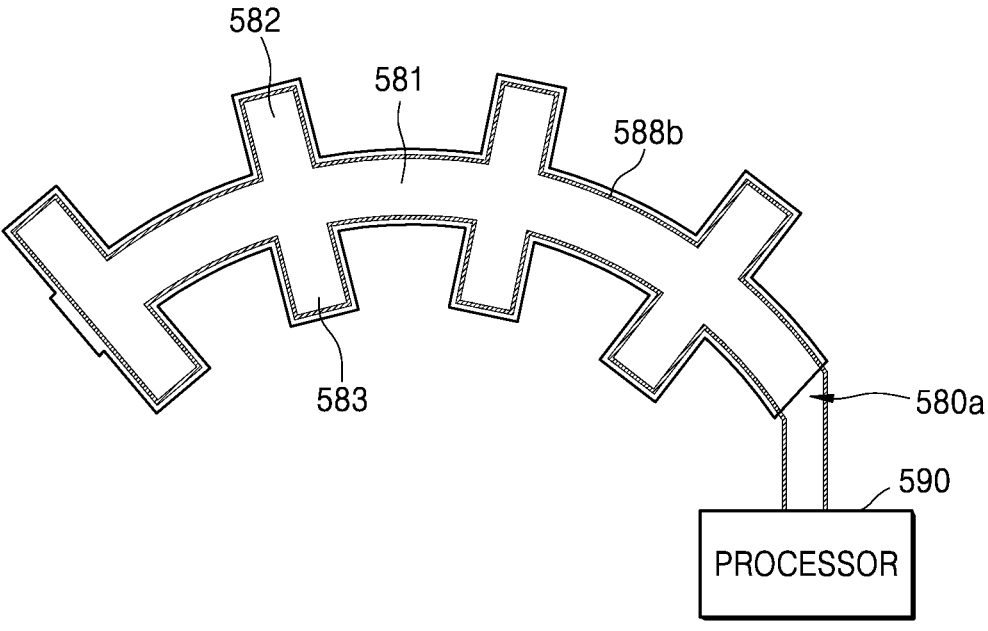
FIG. 8 is a schematic diagram illustrating a friction prevention member provided in a substrate processing apparatus according to another embodiment.

FIG. 8 is a schematic diagram illustrating a friction prevention member provided in a substrate processing apparatus according to another embodiment.

The friction prevention member 580a illustrated in FIG. 8 is almost the same as or similar to the friction prevention member 580a illustrated in FIG. 7, except that a conductor 588b is buried in the friction prevention member 580a. Thus, the descriptions provided above with reference to FIG. 7 will be omitted or briefly provided.

The conductor 588b illustrated in FIG. 8 may be buried in the friction prevention member 580a and extend along an edge of the friction prevention member 580a. The first part 581 may be an area of the friction prevention member 580a having the lowest width-to-length ratio. In the first part 581, an area between the plurality of second parts 582 or the plurality of third parts 583 may have the lowest width-to-length ratio. An area having a low width-to-length ratio is highly likely to be damaged due to an external force such as pressure applied from the outside. Accordingly, the conductor 588b may be arranged to extend along an edge of the first part 581 between the plurality of second parts 582 or the plurality of third parts 583 of the friction prevention member 580a. In order to prevent a situation in which only the friction prevention member 580a is damaged but the conductor 588b is not damaged, the conductor 588b may be arranged sufficiently close to the edge of the friction prevention member 580a.

Figure 9:
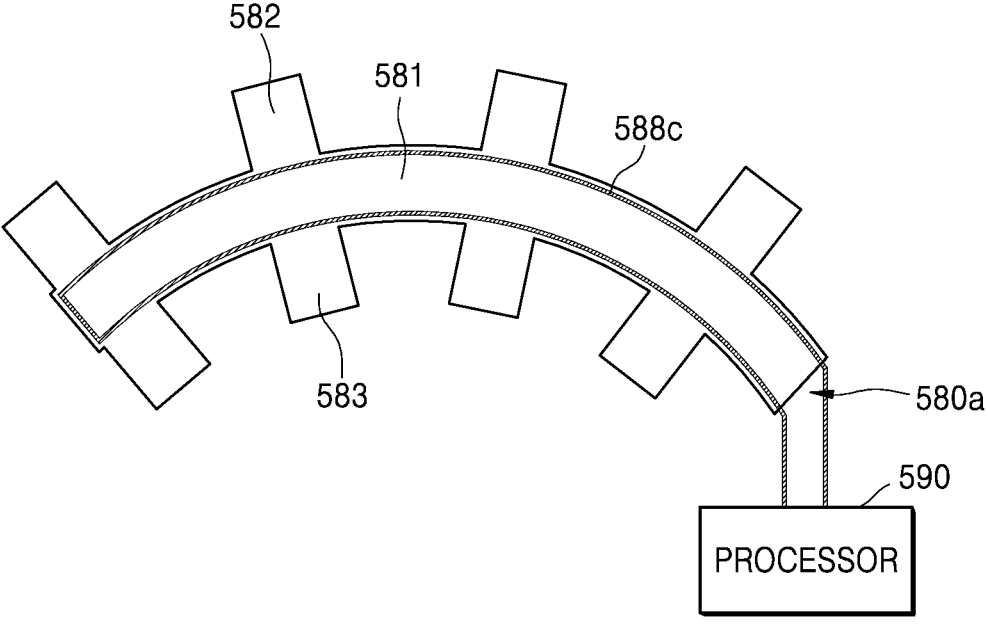
FIG. 9 is a schematic diagram illustrating a friction prevention member provided in a substrate processing apparatus according to another embodiment.

FIG. 9 is a schematic diagram illustrating a friction prevention member provided in a substrate processing apparatus according to another embodiment.

The friction prevention member 580a illustrated in FIG. 9 is almost the same as or similar to the friction prevention member 580a illustrated in FIG. 8, except that a conductor 588c is formed in a U shape along the first part 581 of the friction prevention member 580a. Thus, the descriptions provided above with reference to FIG. 8 will be omitted or briefly provided.

The conductor 588c illustrated in FIG. 9 may be formed in a U shape along the first part 581 of the friction prevention member 580a. As described above, the first part 581 of the friction prevention member 580a is highly likely to be damaged by an external force such as external pressure. Accordingly, the conductor 588c extends along the inner rim of the first part 581 of the friction prevention member 580a, and when the conductor 588c is damaged together with the friction prevention member 580a, the conductor 588c may notify of the damage through the processor 590. As the conductor 588c of the friction prevention member 580a is buried only in the first part 581, the difficulty of a process of forming the conductor 588c may be reduced.

Figure 10:
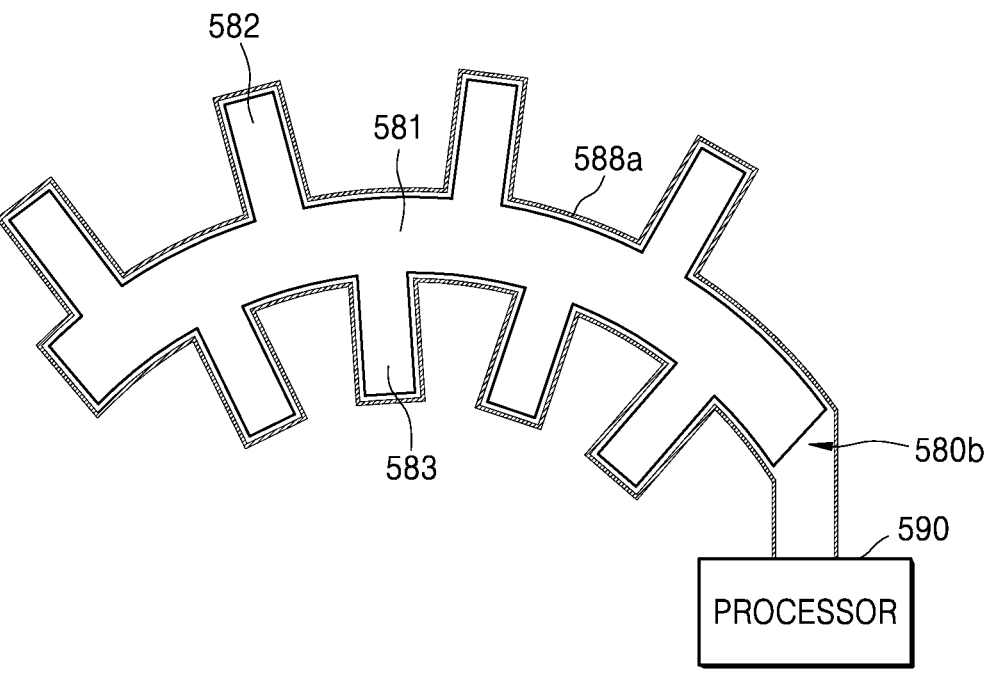
FIG. 10 is a schematic diagram illustrating a friction prevention member provided in a substrate processing apparatus according to another embodiment.
Figure 11:
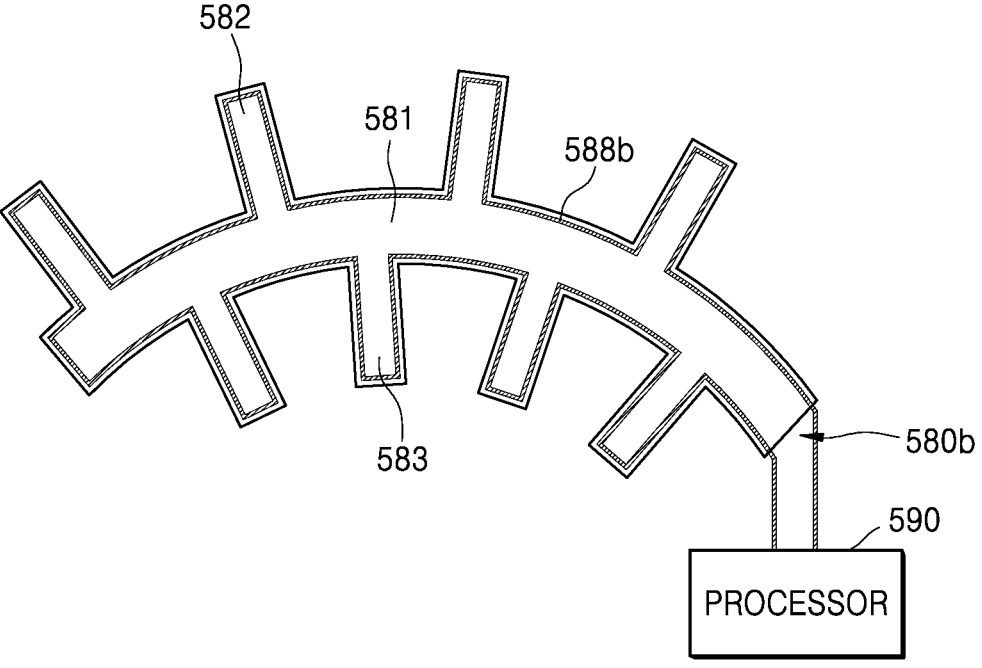
FIG. 11 is a schematic diagram illustrating a friction prevention member provided in a substrate processing apparatus according to another embodiment.
Figure 12:
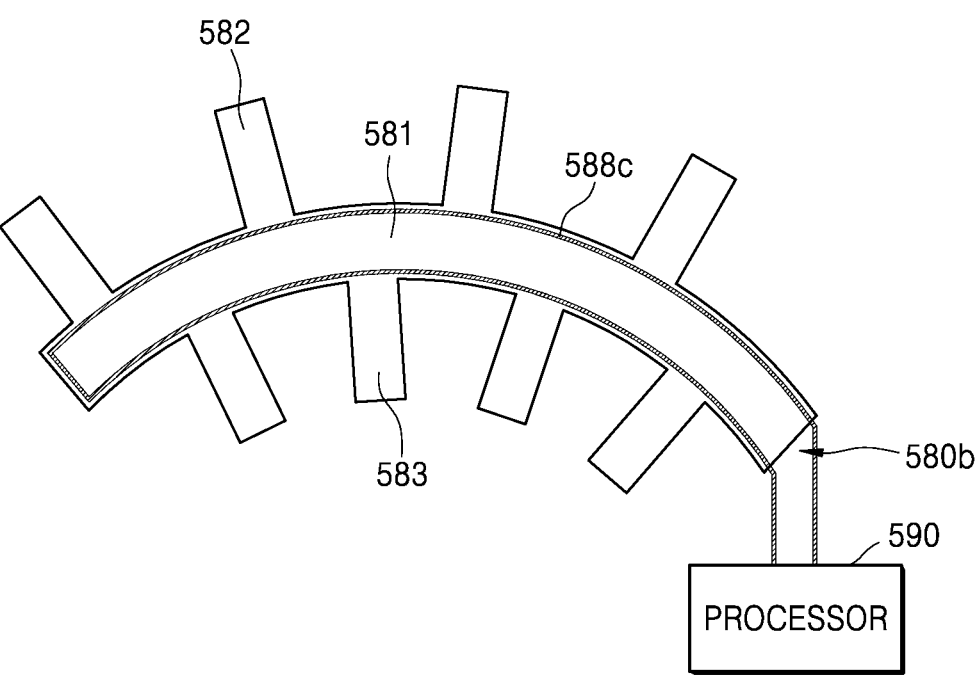
FIG. 12 is a schematic diagram illustrating a friction prevention member provided in a substrate processing apparatus according to another embodiment.

FIGS. 10, 11, and 12 is schematic diagrams each illustrating a friction prevention member provided in a substrate processing apparatus according to another embodiment.

Friction prevention members 580b illustrated in FIGS. 10 to 12 are almost the same or similar to the friction prevention members 580a illustrated in FIGS. 7 to 9, except that the second part 582 and the third part 583 are arranged to alternate with each other in one direction in which the first part 581 extends. Thus, the descriptions provided above with reference to FIG. 7 to FIG. 9 will be omitted or briefly provided.

According to an embodiment, the second part 582 and the third part 583 of the friction prevention member 580b may be formed to alternate with each other from the first part 581. In a case in which the second part 582 and the third part 583 are formed to alternate with each other from the first part 581, an external force, such as pressure applied to the first part 581, may be distributed. Accordingly, the probability that the friction prevention member 580b is damaged together with the conductor 588a is reduced.

Figure 13:
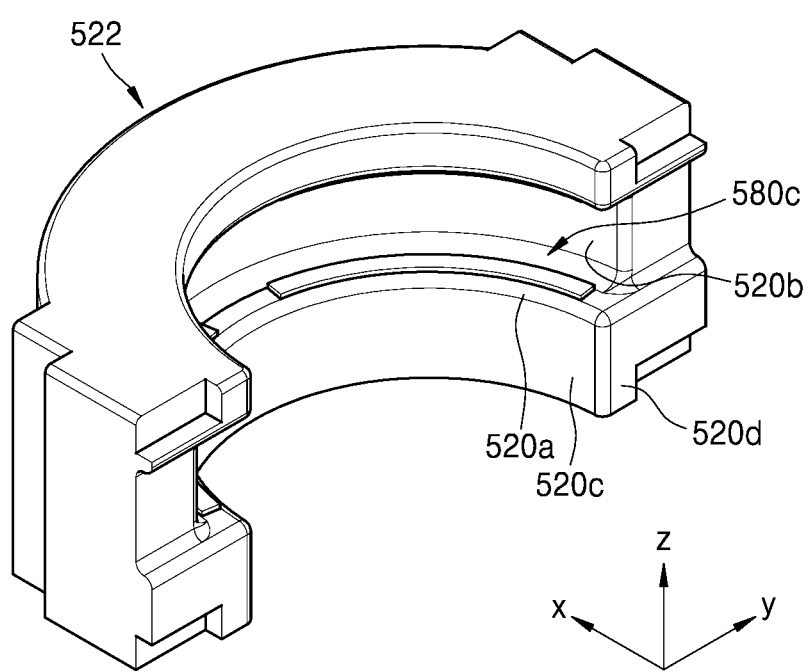
FIG. 13 is a perspective view illustrating a clamp body provided with a friction prevention member, according to another embodiment.
Figure 14:
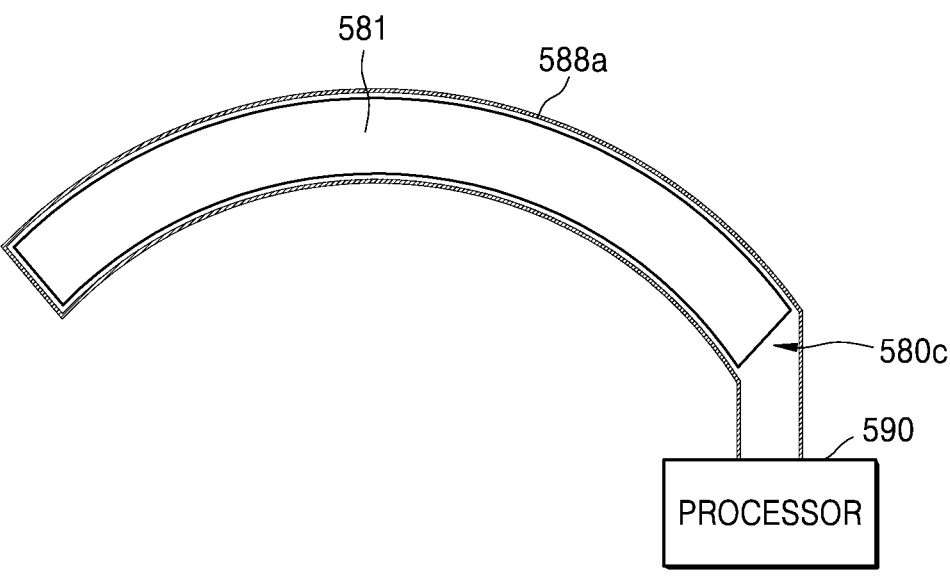
FIG. 14 is a schematic diagram illustrating a friction prevention member provided in a substrate processing apparatus according to another embodiment.
Figure 15:
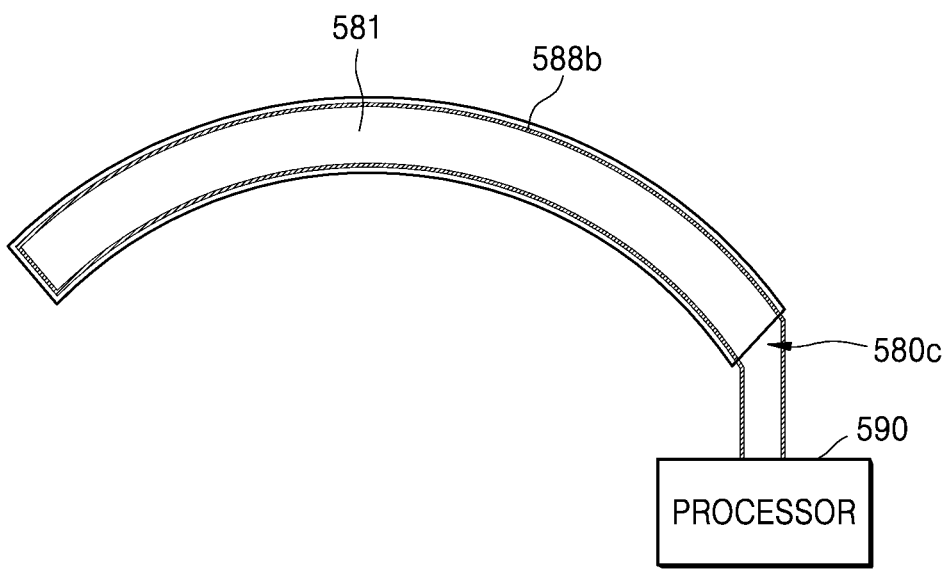
FIG. 15 is a schematic diagram illustrating a friction prevention member provided in a substrate processing apparatus according to another embodiment.

FIG. 13 is a perspective view illustrating a clamp body provided with a friction prevention member, according to another embodiment, and FIG. 14 is a schematic diagram illustrating a friction prevention member provided in a substrate processing apparatus according to another embodiment. FIG. 15 is a schematic diagram illustrating a friction prevention member provided in a substrate processing apparatus according to another embodiment.

Unlike the friction prevention members 580a and 580b illustrated in FIGS. 4 to 12, friction prevention member 580c illustrated in FIGS. 13, 14, and 15 do not include the second part 582 and the third part 583 formed to extend from the first part 581 to intersect the direction in which the first part 581 extends. Accordingly, the friction prevention members 580c may be easily manufactured, and the difficulty of forming the conductors 588a and 588b may be reduced.

Figure 16:
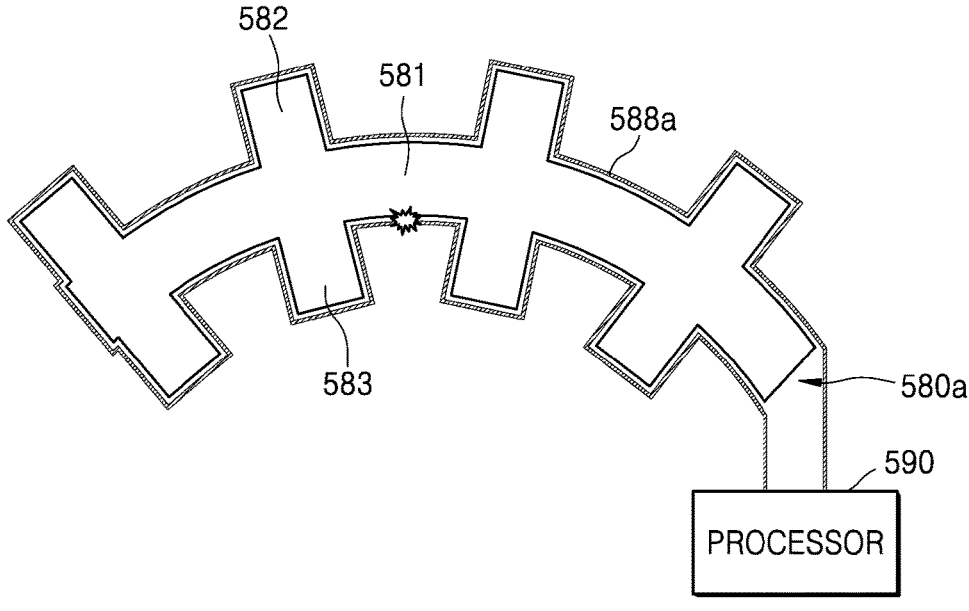
FIGS. 16 and 17 are configuration diagrams illustrating an operation process of a processor according to an embodiment.
Figure 17:
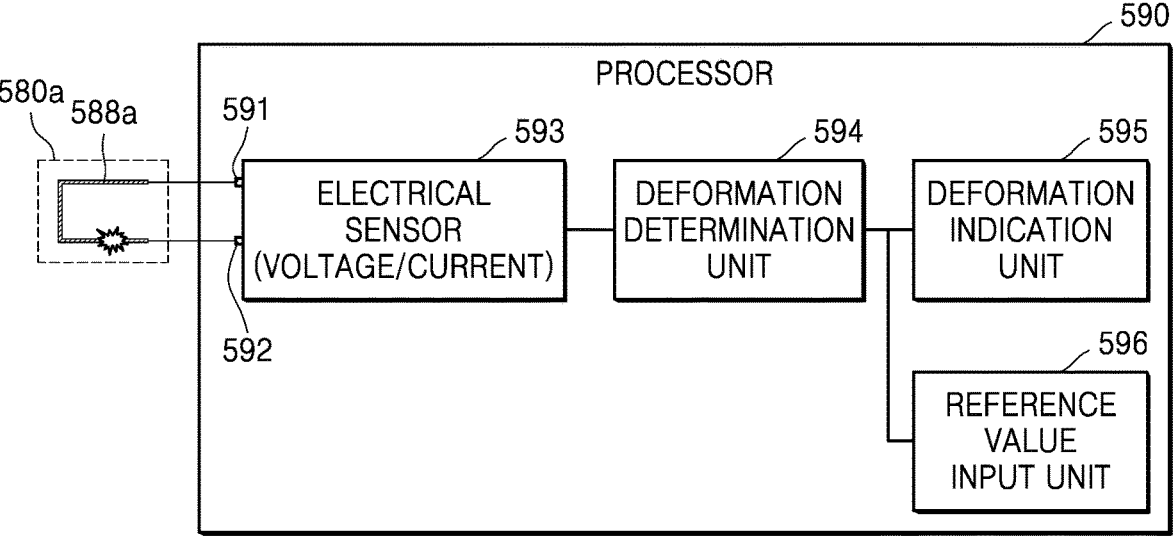

FIGS. 16 and 17 are configuration diagrams illustrating an operation process of a processor according to an embodiment.

The processor 590 may include an electrical sensor 593 configured to detect an output signal output from the conductor 588a. The electrical sensor 593 may include the positive terminal 591 and the negative terminal 592, one end of the conductor 588a may be connected to the positive terminal 591, and the other end of the conductor 588a may be connected to the negative terminal 592. The electrical sensor 593 may measure a voltage between the positive terminal 591 and the negative terminal 592 based on voltages at respective positions. Measurement of the voltages at the respective positions may be performed individually or simultaneously. Probes may be used for a contact for measuring the voltages at the respective positions. In addition, in order to reduce the number of connection lines connected to the probes, it is preferable to use a single interconnection line for connection lines using a voltage at the same measurement position.

However, the electrical sensor 593 may be configured to measure a current as well as a voltage. In this case, a current flowing through the conductor 588a having a certain resistance and connected to the electrical sensor 593 may be measured.

According to an embodiment, the processor 590 may include a deformation determination unit 594, a deformation indication unit 595, and a reference value input unit 596. The deformation determination unit 594 may determine whether the conductor 588a is deformed, by comparing the voltage measured by the electrical sensor 593 with a preset reference value.

The deformation determination unit 594 may determine whether the conductor 588a is deformed, by comparing the voltage measured by the electrical sensor 593 with the reference value that is preset through the reference value input unit 596. When the conductor 588a is deformed, a circuit between the positive terminal 591 and the negative terminal 592 may be in an open state. Accordingly, the voltage difference between the positive terminal 591 and the negative terminal 592 increases, or the current flowing through the conductor 588a decreases. The deformation determination unit 594 may determine that the conductor 588a has been deformed, based on the voltage measured by the electrical sensor 593 being greater than the voltage reference value that is preset through the reference value input unit 596. Alternatively, the deformation determination unit 594 may determine that the conductor 588a has been deformed, based on the current flowing through the conductor 588a measured by the electrical sensor 593 being less than a preset current reference value.

The deformation determination unit 594 included in the processor 590 may be configured to detect whether the conductor 588a is deformed, from an output signal that is output in response to an electrical signal applied to the conductor 588a. According to the above description, the electrical signal applied to the conductor 588a may be a voltage or a current applied by the processor 590. In addition, the output signal that is output from the conductor 588a may mean an increase in voltage between the positive terminal 591 and the negative terminal 592 or a decrease in current flowing through the conductor 588a.

In a case in which the deformation determination unit 594 determines that the conductor 588a has been deformed, the deformation indication unit 595 may visually or audibly indicate a deformation state. The visual indication of the deformation state may be performed by using a device such as a light-emitting diode (LED), and the audible indication of the deformation state may be performed by using a device such as a buzzer.

As illustrated in FIGS. 16 and 17, in a case in which the conductor 588a is deformed, the conductor 588a transmits an output signal to the processor 590 in response to a voltage or a current applied by the processor 590. Here, the output signal may mean a decrease in current flowing through the conductor 588a, or an increase in voltage between the negative terminal 592 and the positive terminal 591 connected to the conductor 588a. Then, after detecting the output signal, the electrical sensor 593 may transmit the output signal to the deformation determination unit 594. The deformation determination unit 594 may receive the voltage or current measured by the electrical sensor 593, and determine that the conductor 588a has been deformed, based on the voltage or current being out of the range of a reference voltage or a reference current stored in the reference value input unit 596. The deformation indication unit 595 receives, from the deformation determination unit 594, information about whether the conductor 588a has been deformed, and indicates that the conductor 588a has been deformed.

Embodiments have been described herein and illustrated in the drawings. Although the embodiments have been described herein by using specific terms, they are used only for the purpose of explaining the technical spirit of the disclosure and not used to limit the meaning or scope of the claims. Therefore, those of skill in the art will understand that various modifications and other equivalent embodiments may be derived from the embodiments described herein. Therefore, the true technical protection scope of the disclosure should be determined by the appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a body having a substrate treatment space therein;
a fluid supply unit configured to supply a treatment fluid to the substrate treatment space;
a fluid exhaust line to exhaust the treatment fluid from the substrate treatment space;
a clamp body configured to surround and fix the body;
a friction prevention member arranged between the body and the clamp body and configured to prevent friction between the body and the clamp body;
a conductor extending along at least a portion of an outer rim of the friction prevention member; and
a processor configured to detect whether the conductor has been deformed, based on an output signal output from the conductor in response to an electrical signal applied to the conductor.

2. The substrate processing apparatus of claim 1, wherein the body comprises:
an upper body; and
a lower body that moves relative to the upper body,
wherein the friction prevention member is further configured to prevent friction between the upper body and the clamp body and between the lower body and the clamp body.

3. The substrate processing apparatus of claim 1, wherein the processor comprises an electrical sensor configured to detect an output signal that is output from the conductor, one end of the conductor is connected to a positive terminal of the electrical sensor, and another end of the conductor is connected to a negative terminal of the electrical sensor.

4. The substrate processing apparatus of claim 3, wherein the processor further comprises a deformation determination unit configured to determine whether the conductor has been deformed, based on the output signal detected by the electrical sensor.

5. The substrate processing apparatus of claim 4, wherein the processor further comprises a deformation indication unit configured to receive, from the deformation determination unit, information about whether the conductor has been deformed, and generate a signal representing that the conductor has been deformed.

6. The substrate processing apparatus of claim 1, wherein the friction prevention member comprises:

a first part extending in a direction;

a second part extending in an upward direction from the first part to intersect the direction in which the first part extends; and a third part extending in a downward direction from the first part to intersect the direction in which the first part extends.

7. The substrate processing apparatus of claim 6, wherein the second part and the third part are arranged to alternate with each other in the direction in which the first part extends.

8. The substrate processing apparatus of claim 6, wherein, in the friction prevention member, the first part, the second part, and the third part are formed into one body.

9. The substrate processing apparatus of claim 1, wherein the conductor comprises a wire having a diameter of about 0.05 mm to about 0.15 mm.

10. The substrate processing apparatus of claim 1, wherein the friction prevention member comprises a polyimide film.

11. A substrate processing apparatus comprising:

a chamber body comprising a first body and a second body, which is formed to be movable relative to the first body, the chamber body having a substrate treatment space therein;

a clamp body to fix the first body and the second body when the first body and the second body are at closing position at which the first body and the second body are in contact with each other;

a friction prevention member attached to the clamp body and configured to prevent friction between the chamber body and the clamp body;

a conductor buried in the friction prevention member; and a processor configured to detect whether the conductor has been deformed, based on an output signal output from the conductor in response to an electrical signal applied to the conductor.

12. The substrate processing apparatus of claim 11, wherein the friction prevention member extends in a first direction, and the conductor extends along a direction along which an edge of the friction prevention member extends.

13. The substrate processing apparatus of claim 11, wherein the friction prevention member comprises:

a first part extending in a direction; and a second part extending from the first part to intersect the direction in which the first part extends.

14. The substrate processing apparatus of claim 13, wherein the conductor includes a first portion extending along a direction along which an edges of the first part extends, and a second portion extending along a direction along which an edge of the second part extends.

15. The substrate processing apparatus of claim 13, wherein the conductor has a U shape and is buried in the first part.

16. The substrate processing apparatus of claim 11, wherein a plurality of friction prevention members are arranged to be spaced apart from each other.

17. The substrate processing apparatus of claim 16, wherein, in a top view, some of the plurality of friction prevention members are arranged to be spaced apart from each other in a circumferential direction.

18. The substrate processing apparatus of claim 11, wherein the friction prevention member comprises a polyimide film.

19. A substrate processing apparatus comprising:

a chamber body comprising a first body and a second body, which is formed to be movable relative to the first body, the chamber body having a substrate treatment space therein;

a fluid supply unit configured to supply a treatment fluid to the substrate treatment space;

a fluid exhaust line to exhaust the treatment fluid from the substrate treatment space;

a clamp body to fix the first body and the second body when the first body and the second body are at closing position at which the first body and the second body are in contact with each other;

a friction prevention member attached to the clamp body and configured to prevent friction between the chamber body and the clamp body;

a conductor installed along an outer rim of the friction prevention member; and a processor configured to detect whether the conductor has been deformed, based on an output signal that is output from the conductor in response to an electrical signal applied to the conductor, wherein the friction prevention member comprises:

a first part extending lengthwise in one direction;

a second part extending in an upward direction from the first part to intersect the direction in which the first part extends; and a third portion extending in a downward direction from the first part to intersect the direction in which the first part extends, the first part, the second part, and the third part are formed into one body, a plurality of friction prevention members are provided to be spaced apart from each other, in a top view, some of the plurality of friction prevention members are arranged to be spaced apart from each other in a circumferential direction, the conductor comprises a wire having a diameter of about 0.05 mm to about 0.15 mm, and the plurality of friction prevention members each comprise a polyimide film.

20. The substrate processing apparatus of claim 19, wherein the processor comprises:

an electrical sensor configured to detect an output signal that is output from the conductor;

a deformation determination unit configured to determine whether the conductor has been deformed, based on the output signal detected by the electrical sensor; and a deformation indication unit configured to receive, from the deformation determination unit, information about whether the conductor has been deformed, and generate a signal representing that the conductor has been deformed, one end of the conductor is connected to a positive terminal of the electrical sensor, and another end of the conductor is connected to a negative terminal of the electrical sensor.

\* \* \* \* \*